(12) United States Patent
Kim

(10) Patent No.: US 8,928,354 B2
(45) Date of Patent: Jan. 6, 2015

(54) CLOCK-DELAYED DOMINO LOGIC CIRCUIT AND DEVICES INCLUDING THE SAME

(71) Applicant: Samsung Electronics Co., Ltd., Gyeonggi-do (KR)

(72) Inventor: Min Su Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 82 days.

(21) Appl. No.: 13/725,208

(22) Filed: Dec. 21, 2012

(65) Prior Publication Data

US 2013/0257480 A1 Oct. 3, 2013

(30) Foreign Application Priority Data

Apr. 2, 2012 (KR) .................. 10-2012-0033776

(51) Int. Cl.
*H03K 19/096* (2006.01)

(52) U.S. Cl.
CPC .......... *H03K 19/0963* (2013.01); *H03K 19/096* (2013.01); *H03K 19/0966* (2013.01)
USPC .................... 326/98; 326/93; 326/95; 326/97

(58) Field of Classification Search
USPC ....................................................... 326/93–98
See application file for complete search history.

(56) References Cited

U.S. PATENT DOCUMENTS

| | | | |
|---|---|---|---|
| 5,378,942 A * | 1/1995 | Wu et al. ........................ | 326/97 |
| 5,541,536 A | 7/1996 | Rajivan | |
| 6,265,899 B1 * | 7/2001 | Abdel-Hafeez et al. ........ | 326/96 |
| 6,498,514 B2 * | 12/2002 | Alvandpour ..................... | 326/98 |
| 6,549,038 B1 * | 4/2003 | Sechen et al. ................... | 326/93 |
| 6,650,172 B1 | 11/2003 | Shingyouchi | |
| 6,707,317 B2 * | 3/2004 | Ebergen et al. ................. | 326/95 |
| 6,831,483 B2 | 12/2004 | Shimazaki et al. | |
| 6,842,045 B2 | 1/2005 | Shimazaki et al. | |
| 6,859,917 B2 | 2/2005 | Shimazaki et al. | |
| 7,864,625 B2 | 1/2011 | Carpenter et al. | |
| 8,026,701 B2 | 9/2011 | Kim et al. | |
| 8,659,320 B2 * | 2/2014 | Lee ................................. | 326/95 |
| 2006/0139061 A1 * | 6/2006 | Curtis et al. ................... | 326/95 |
| 2007/0146036 A1 | 6/2007 | Kwon | |
| 2007/0286323 A1 | 12/2007 | Shimobeppu | |
| 2008/0061836 A1 * | 3/2008 | Cheng ............................ | 326/97 |
| 2010/0141323 A1 | 6/2010 | Kim | |
| 2010/0182848 A1 * | 7/2010 | Hotta et al. ............. | 365/189.05 |
| 2011/0095797 A1 | 4/2011 | Choi et al. | |
| 2013/0234759 A1 * | 9/2013 | Singh et al. ..................... | 326/97 |
| 2013/0246834 A1 * | 9/2013 | Shim et al. ..................... | 713/501 |

FOREIGN PATENT DOCUMENTS

| | | | |
|---|---|---|---|
| JP | 2001332695 A | 11/2001 | |
| JP | 2010211302 A | 9/2010 | |
| KR | 20000060392 A | 10/2000 | |

* cited by examiner

*Primary Examiner* — Vibol Tan
(74) *Attorney, Agent, or Firm* — F. Chau & Associates, LLC

(57) ABSTRACT

A clock-delayed domino logic circuit includes a precharge circuit configured to control connection between a first node and a dynamic node in response to a clock signal, an evaluation circuit configured to control connection between a second node and an evaluation node in response to the clock signal, a logic network connected between the dynamic node and the evaluation node, the logic network configured to determine a logic level of the dynamic node based on a plurality of input signals, and a phase control circuit configured to output a logic level of the evaluation node or a logic level of the first node according to a level of the clock signal.

15 Claims, 9 Drawing Sheets

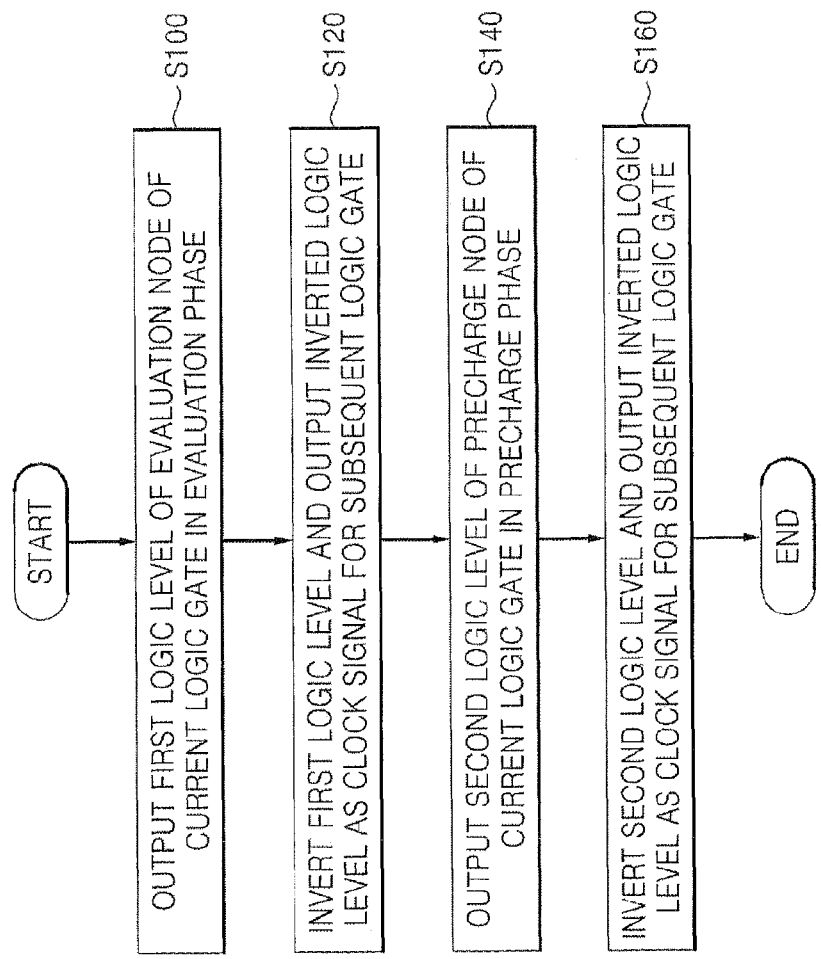

US 8,928,354 B2

CLOCK-DELAYED DOMINO LOGIC CIRCUIT AND DEVICES INCLUDING THE SAME

CROSS-REFERENCE TO RELATED APPLICATIONS

This application claims priority under 35 U.S.C. §119 to Korean Patent Application No. 10-2012-0033776, filed on Apr. 2, 2012 in the Korean Intellectual Property Office (KIPO), the entire contents of which are incorporated herein by reference.

BACKGROUND

Embodiments of the inventive concept relate to a semiconductor logic circuit, and more particularly, to a clock-delayed domino logic circuit robust to on-chip variation (OCV) and devices including the same.

With the increasing demand on a high-performance mobile central processing unit (CPU), the importance of a digital circuit that can operate at high speed in the CPU is increasing.

Domino logic is used for the digital circuit. The domino logic is a complementary metal oxide semiconductor (CMOS)-based evolution of dynamic logic techniques based on either P-channel MOS (PMOS) or N-channel MOS (NMOS) transistors.

The domino logic includes stages connected in cascade and a buffer between the stages to delay a clock signal. The domino logic is also referred to as clock-delayed domino logic. For the reliable operation of the clock-delayed domino logic, the evaluation or pull-down of a logic network of the clock-delayed domino logic may be terminated while the buffer is delaying the clock signal.

SUMMARY

According to an embodiment of the inventive concept, there is provided a clock-delayed domino logic circuit including a precharge circuit configured to control connection between a first node and a dynamic node in response to a clock signal, an evaluation circuit configured to control connection between a second node and an evaluation node in response to the clock signal, a logic network connected between the dynamic node and the evaluation node, wherein the logic network is configured to determine a logic level of the dynamic node based on a plurality of input signals, and a phase control circuit configured to output a logic level of the evaluation node or a logic level of the first node according to a level of the clock signal.

The first node may be one of a power supply node and a ground node and the second node may be the other of the power supply node and the ground node.

The clock-delayed domino logic circuit may further include an inverter configured to invert an output signal of the phase control circuit. The logic network may include an AND gate, an OR gate, a NAND gate, a NOR gate, or an AND-OR-inverter (AOI).

The logic network may include a plurality of N-channel metal oxide semiconductor (NMOS) transistors, which are gated in response to the plurality of input signals. The phase control circuit may output the logic level of the evaluation node when the clock signal is at a high level and may output the logic level of the first node when the clock signal is at a low level.

The logic network may include a plurality of P-channel metal oxide semiconductor (PMOS) transistors, which are gated in response to the plurality of input signals, respectively. The phase control circuit may output the logic level of the first node when the clock signal is at a high level and may output the logic level of the evaluation node when the clock signal is at a low level.

The phase control circuit may include a switch configured to control connection between the first node and the evaluation node in response to the clock signal. The phase control circuit may include an inverter, which is connected between the first node and the evaluation node and inverts the clock signal.

According to an embodiment of the inventive concept, there is provided a data processing device including a clock generator configured to generate a clock signal, a data source configured to output data, and a clock-delayed domino logic circuit. The clock-delayed domino logic circuit includes a precharge circuit configured to control connection between a first node and a dynamic node in response to the clock signal, an evaluation circuit configured to control connection between a second node and an evaluation node in response to the clock signal, a logic network connected between the dynamic node and the evaluation node, wherein the logic network is configured to determine a logic level of the dynamic node based on the data, a phase control circuit configured to output a logic level of the evaluation node or a logic level of the first node according to a level of the clock signal, and an inverter configured to invert an output signal of the phase control circuit.

The phase control circuit may include a switch configured to control connection between the first node and the evaluation node in response to the clock signal. The inverter may be connected between the first node and the evaluation node and inverts the clock signal. The data processing device may be provided in a system-on-chip.

According to an embodiment of the inventive concept, there is provided an electronic device including a processor including a data processing device and a wireless network interface connected to the processor through an interface control block. The data processing device includes a clock generator configured to generate a clock signal, a data source configured to output data, and a clock-delayed domino logic circuit. The clock-delayed domino logic circuit includes a precharge circuit configured to control connection between a first node and a dynamic node in response to the clock signal, an evaluation circuit configured to control connection between a second node and an evaluation node in response to the clock signal, a logic network connected between the dynamic node and the evaluation node, wherein the logic network is configured to determine a logic level of the dynamic node based on the data, a phase control circuit configured to output a logic level of the evaluation node or a logic level of the first node according to a level of the clock signal, and an inverter configured to invert an output signal of the phase control circuit.

The phase control circuit may include a switch configured to control connection between the first node and the evaluation node in response to the clock signal. The inverter may be connected between the first node and the evaluation node and inverts the clock signal.

The data processing device may be provided in a system-on-chip. The electronic device may be a portable device.

According to an embodiment of the inventive concept, there is provided an operation method of a clock-delayed domino logic circuit including logic gates connected in cascade. The operation method includes outputting a first logic level of an evaluation node of a current logic gate among the logic gates in an evaluation phase, and inverting the first logic level and outputting an inverted logic level as a clock signal for a subsequent logic gate among the logic gates in the evaluation phase.

The operation method may further include outputting a second logic level of a precharge node of the current logic gate in a precharge phase, and inverting the second logic level and outputting an inverted logic level as the clock signal for the subsequent logic gate in the precharge phase. The precharge node may be a power supply node or a ground node.

According to an embodiment, there is provided a clock-delayed domino logic circuit comprising a plurality of logic gates connected in cascade, wherein at least one of the logic gates comprises a phase control circuit configured to output a logic level of an evaluation node or a logic level of a power source node or a ground node according to a level of a clock signal and an inverter configured to invert the logic level output from the phase control circuit.

BRIEF DESCRIPTION OF THE DRAWINGS

FIG. 9 is a flowchart of an operation method of a domino logic circuit according to an embodiment of the inventive concept.

DETAILED DESCRIPTION OF EMBODIMENTS

Figure 1:
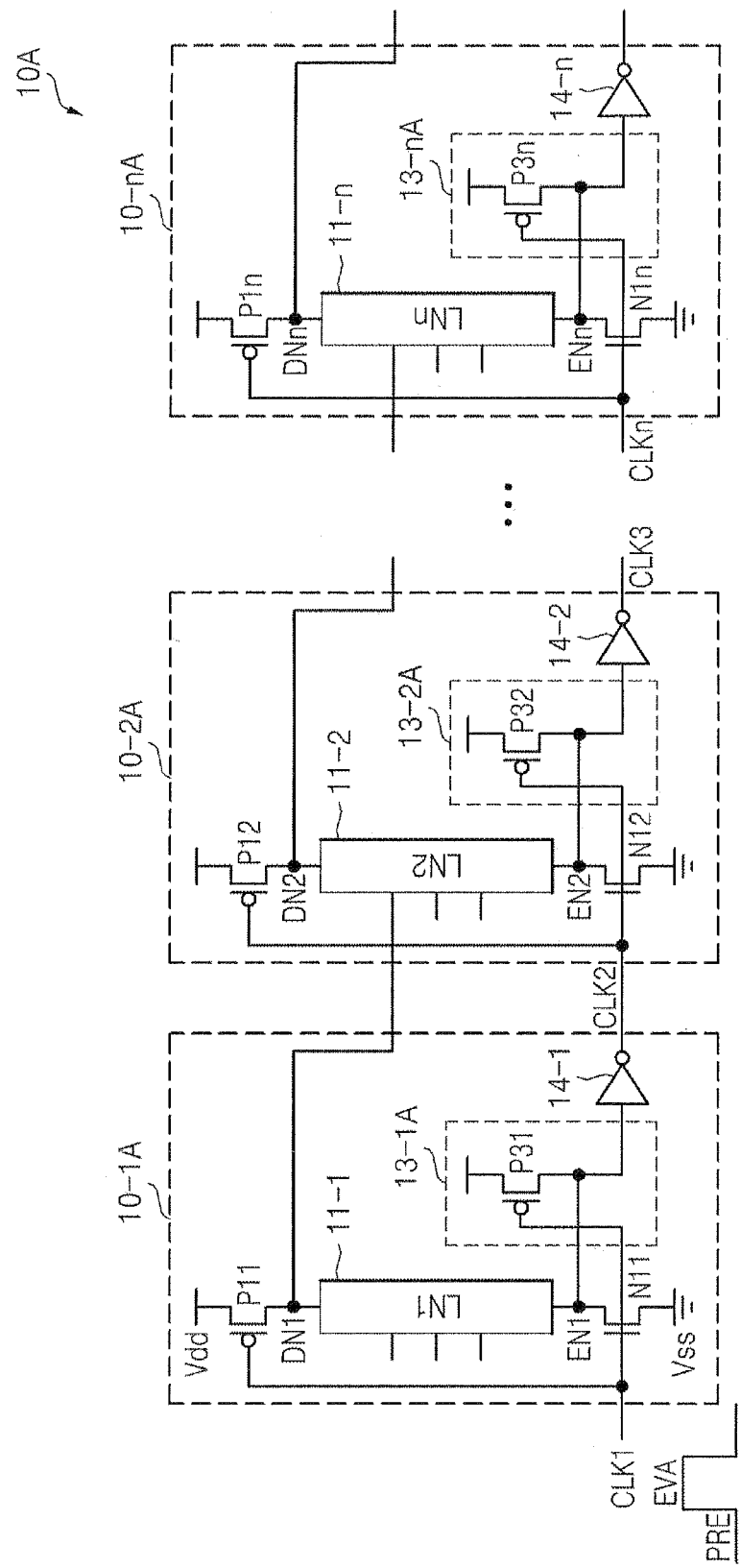
FIG. 1 is a block diagram of a clock-delayed domino logic circuit according to an embodiment of the inventive concept.

Hereinafter, the embodiments of the present invention will be described in detail with reference to the accompanying drawings, wherein the same reference numerals may be used to denote the same or substantially the same elements throughout the specification and the drawings. The present invention may be embodied in various different ways and should not be construed as limited to the exemplary embodiments described herein.

It will be understood that when an element or layer is referred to as being "on," "connected to" or "coupled to" another element or layer, it can be directly on, connected or coupled to the other element or layer or intervening elements or layers may be present.

As used herein, the singular forms, "a," "an" and "the" are intended to include the plural forms as well, unless the context clearly indicates otherwise.

FIG. 1 is a block diagram of a clock-delayed domino logic circuit 10A according to an embodiment of the inventive concept. The clock-delayed domino logic circuit 10A includes logic gates (or logic stages) 10-1A through 10-nA where "n" is a natural number.

The first logic gate 10-1A includes a first precharge circuit P11, a first evaluation circuit N11, a first logic network 11-1, a first phase control circuit 13-1A, and a first inverter 14-1.

The first precharge circuit P11 controls connection between a power supply node (or a precharge node) Vdd and a first dynamic node DN1 in response to a first clock signal CLK1 input to a control terminal. According to an embodiment, the first precharge circuit P11 may be implemented by a P-channel metal oxide semiconductor (PMOS) transistor including the control terminal, e.g., a gate, which receives the first clock signal CLK1.

The first evaluation circuit N11 controls connection between a first evaluation node EN1 and a ground node Vss in response to the first clock signal CLK1 input to a control terminal. According to an embodiment, the first evaluation circuit N11 may be implemented by an N-channel metal oxide semiconductor (NMOS) transistor including the control terminal, e.g., a gate, which receives the first clock signal CLK1. According to an embodiment, the first evaluation circuit N11 may be implemented by a multi-finger transistor.

A node between a logic network and a precharge circuit is referred to as a "dynamic node," and a node between the logic network and an evaluation circuit is referred to as an "evaluation node".

The first logic network 11-1 is connected between the first precharge circuit P11 and the first evaluation circuit N11. The first logic network 11-1 may determine a logic level of the first dynamic node DN1 based on first input signals (or data). According to an embodiment, the first logic network 11-1 may be implemented by a Boolean circuit, such as an AND gate, an OR gate, a NAND gate, a NOR gate, or an AND-OR-inverter (AOI). According to an embodiment, the first logic network 11-1 may be implemented by NMOS transistors that are gated by the first input signals, respectively.

The first phase control circuit 13-1A may output a logic level of the power supply node Vdd or the first evaluation node EN1 in response to the first clock signal CLK1. According to an embodiment, the first phase control circuit 13-1A may be implemented by a PMOS transistor P31 including a control terminal, e.g., a gate, which receives the first clock signal CLK1. The PMOS transistor P31 may control connection between the power supply node Vdd and the first evaluation node EN1 in response to the first clock signal CLK1.

The first inverter 14-1 inverts an output signal of the first phase control circuit 13-1A, e.g., the logic level of the first evaluation node EN1, and outputs the inverted output signal as a second clock signal CLK2 to the second logic gate 10-2A.

When the first clock signal CLK1 is at a first level, e.g., a low level, the first precharge circuit P11 applies a precharge voltage, e.g., a power supply voltage, to the first dynamic node DN1 in response to the first clock signal CLK1. The PMOS transistor P31 of the first phase control circuit 13-1A applies the power supply voltage to the first evaluation node EN1, and the first evaluation circuit N11 is disabled in response to the first clock signal CLK1.

The first inverter 14-1 inverts the logic level of the power supply node Vdd, e.g., a high level, and outputs the inverted logic level, e.g., a low level, to the second logic gate 10-2A as the second clock signal CLK2.

In a precharge phase (or a precharge operation) PRE, the first clock signal CLK1 remains at the first level.

When the first clock signal CLK1 is at a second level, e.g., a high level, the first precharge circuit P11 and the PMOS transistor P31 of the first phase control circuit 13-1A are disabled. The first evaluation circuit N11 is enabled in response to the first clock signal CLK1. Accordingly, the logic level of the first evaluation node EN1 becomes a low level. The first evaluation circuit N11 creates an evaluation path in response to the first clock signal CLK1. Therefore, the first logic network 11-1 determines the logic level of the first dynamic node DN1 based on the first input signals.

The first inverter 14-1 inverts the logic level of the first evaluation node EN1, e.g., the low level, and outputs the inverted logic level, e.g., a high level, to the second logic gate 10-2A as the second clock signal CLK2.

In an evaluation phase (or an evaluation operation) EVA, the first clock signal CLK1 remains at the second level.

The precharge phase PRE indicates when a clock signal is at a low level and a logic gate is of N-type or when the clock signal is at a high level and the logic gate is of P-type. The evaluation phase EVA indicates when the clock signal is at the high level and the logic gate is of N-type or when the clock signal is at the low level and the logic gate is of P-type. A precharge node is the power supply node Vdd when the logic gate is N-type and is the ground node Vss when the logic gate is P-type. According to an embodiment, N-type may refer to when a logic network is implemented by NMOS transistors. According to an embodiment, P-type may refer to when the logic network is implemented by PMOS transistors.

The second logic gate 10-2A includes a second precharge circuit P12, a second evaluation circuit N12, a second logic network 11-2, a second phase control circuit 13-2A, and a second inverter 14-2.

The second precharge circuit P12 controls connection between the power supply node Vdd and a second dynamic node DN2 in response to the second clock signal CLK2 input to a control terminal. According to an embodiment, the second precharge circuit P12 may be implemented by a PMOS transistor including the control terminal, e.g., a gate, which receives the second clock signal CLK2.

The second evaluation circuit N12 controls connection between a second evaluation node EN2 and the ground node Vss in response to the second clock signal CLK2 input to a control terminal. According to an embodiment, the second evaluation circuit N12 may be implemented by an NMOS transistor including the control terminal, e.g., a gate, which receives the second clock signal CLK2. According to an embodiment, the second evaluation circuit N12 may be implemented by a multi-finger transistor.

The second logic network 11-2 is connected between the second precharge circuit P12 and the second evaluation circuit N12. The second logic network 11-2 may determine a logic level of the second dynamic node DN2 based on second input signals (or data). One of the second input signals may correspond to the logic level of the first dynamic node DN1. According to an embodiment, the second logic network 11-2 may be implemented by a Boolean circuit, such as an AND gate, an OR gate, a NAND gate, a NOR gate, or an AOI. According to an embodiment, the second logic network 11-2 may be implemented by NMOS transistors that are gated by the second input signals, respectively.

The second phase control circuit 13-2A may output the logic level of the power supply node Vdd or the second evaluation node EN2 in response to the second clock signal CLK2. According to an embodiment, the second phase control circuit 13-2A may be implemented by a PMOS transistor P32 including a control terminal, e.g., a gate, which receives the second clock signal CLK2. The PMOS transistor P32 may control connection between the power supply node Vdd and the second evaluation node EN2 in response to the second clock signal CLK2.

The second inverter 14-2 inverts an output signal of the second phase control circuit 13-2A, e.g., the logic level of the second evaluation node EN2 and outputs the inverted output signal as a third clock signal CLK3.

When the second clock signal CLK2 is at a first level, e.g., a low level, the second precharge circuit P12 applies the precharge voltage, e.g., the power supply voltage, to the second dynamic node DN2 in response to the second clock signal CLK2. The PMOS transistor P32 of the second phase control circuit 13-2A applies the power supply voltage to the second evaluation node EN2, and the second evaluation circuit N12 is disabled in response to the second clock signal CLK2.

The second inverter 14-2 inverts the logic level, e.g., the high level, of the power supply node Vdd and outputs the inverted logic level, e.g., the low level, as the second clock signal CLK2.

When the second clock signal CLK2 is at a second level, e.g., a high level, the second precharge circuit P12 and the PMOS transistor P32 of the second phase control circuit 13-2A are disabled. The second evaluation circuit N12 is enabled in response to the second clock signal CLK2. Accordingly, the logic level of the second evaluation node EN2 becomes a low level. The second evaluation circuit N12 creates an evaluation path in response to the second clock signal CLK2. Therefore, the second logic network 11-2 determines the logic level of the second dynamic node DN2 based on the second input signals.

The second inverter 14-2 inverts the logic level of the second evaluation node EN2, e.g., the low level and outputs the inverted logic level, e.g., a high level as the third clock signal CLK3.

The n-th logic gate 10-nA includes an n-th precharge circuit P1$n$, an n-th evaluation circuit N1$n$, an n-th logic network 11-$n$, an n-th phase control circuit 13-nA, and an n-th inverter 14-$n$.

The n-th precharge circuit P1$n$ controls connection between the power supply node Vdd and an n-th dynamic node DNn in response to an n-th clock signal CLKn input to a control terminal According to an embodiment, the n-th precharge circuit P1$n$ may be implemented by a PMOS transistor including the control terminal, e.g., a gate, which receives the n-th clock signal CLKn.

The n-th evaluation circuit N1$n$ controls connection between an n-th evaluation node ENn and the ground node Vss in response to the n-th clock signal CLKn input to a control terminal. According to an embodiment, the n-th evaluation circuit N1$n$ may be implemented by an NMOS transistor including the control terminal, e.g., a gate, which receives the n-th clock signal CLKn. According to an embodiment, the n-th evaluation circuit N1$n$ may be implemented by a multi-finger transistor.

The n-th logic network 11-$n$ is connected between the n-th precharge circuit P1$n$ and the n-th evaluation circuit N1$n$. The n-th logic network 11-$n$ may determine a logic level of the n-th dynamic node DNn based on n-th input signals (or data). One of the n-th input signals may correspond to the logic level of an (n−1)-th dynamic node. According to an embodiment, the n-th logic network 11-$n$ may be implemented by a Boolean circuit, such as an AND gate, an OR gate, a NAND gate, a NOR gate, or an AOI. According to an embodiment, the n-th logic network 11-$n$ may be implemented by NMOS transistors that are gated by the n-th input signals, respectively.

The n-th phase control circuit 13-nA may output the logic level of the power supply node Vdd or the n-th evaluation node ENn in response to the n-th clock signal CLKn. According to an embodiment, the n-th phase control circuit 13-nA may be implemented by a PMOS transistor P3$n$ including a control terminal, e.g., a gate, which receives the n-th clock signal CLKn. The PMOS transistor P3$n$ may control connection between the power supply node Vdd and the n-th evaluation node ENn in response to the n-th clock signal CLKn.

The n-th inverter 14-n inverts an output signal of the n-th phase control circuit 13-nA, e.g., the logic level of the n-th evaluation node ENn and outputs the inverted output signal.

When the n-th clock signal CLKn is at a first level, e.g., a low level, the n-th precharge circuit P1n applies the precharge voltage, e.g., the power supply voltage, to the n-th dynamic node DNn in response to the n-th clock signal CLKn. The PMOS transistor P3n of the n-th phase control circuit 13-nA applies the power supply voltage to the n-th evaluation node ENn, and the n-th evaluation circuit N1n is disabled in response to the n-th clock signal CLKn.

The n-th inverter 14-n inverts the logic level of the power supply node Vdd, e.g., the high level and outputs the inverted logic level, e.g., the low level.

When the n-th clock signal CLKn is at a second level, e.g., a high level, the n-th precharge circuit P1n and the PMOS transistor P3n of the n-th phase control circuit 13-nA are disabled. The n-th evaluation circuit N1n is enabled in response to the n-th clock signal CLKn. Accordingly, the logic level of the n-th evaluation node ENn becomes a low level. The n-th evaluation circuit N1n creates an evaluation path in response to the n-th clock signal CLKn. Therefore, the n-th logic network 11-n determines the logic level of the n-th dynamic node DNn based on the n-th input signals.

The n-th inverter 14-n inverts the logic level of the n-th evaluation node ENn, e.g., the low level and outputs the inverted logic level, e.g., a high level.

During the evaluation of a current logic stage, e.g., the first logic stage 10-1A, for example, while the logic level of the first dynamic node DN1 is determined, the clock-delayed domino logic circuit 10A delays a clock signal output to a subsequent logic stage, e.g., the second clock signal CLK2, thereby reducing the influence of on-chip variation (OCV).

Figure 2:
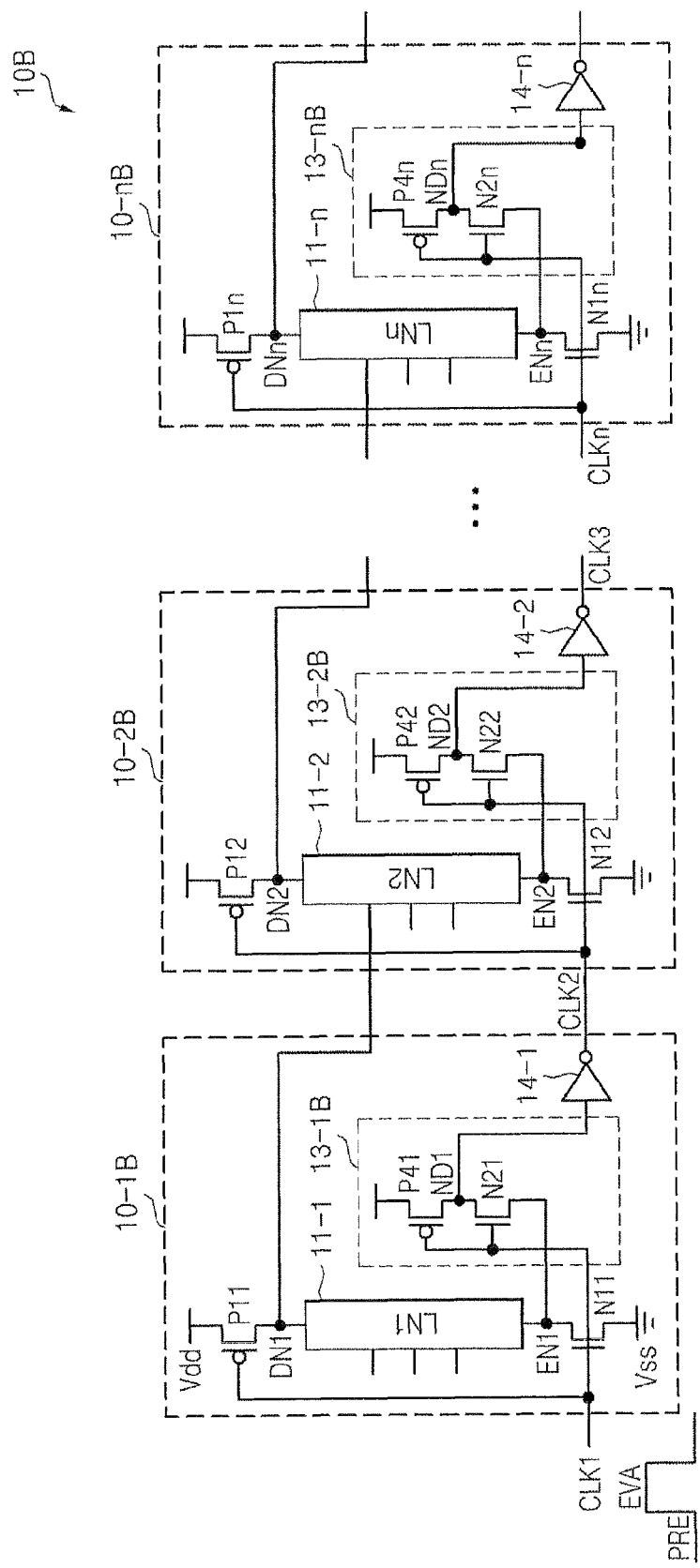
FIG. 2 is a block diagram of a clock-delayed domino logic circuit according to an embodiment of the inventive concept.

FIG. 2 is a block diagram of a clock-delayed domino logic circuit 10B according to an embodiment of the inventive concept. Referring to FIG. 2, the clock-delayed domino logic circuit 10B includes logic gates (or logic stages) 10-1B through 10-nB where "n" is a natural number.

The first logic gate 10-1B includes the first precharge circuit P11, the first logic network 11-1, the first evaluation circuit N11, a first phase control circuit 13-1B, and the first inverter 14-1. Except for the phase control circuits 13-1B through 13-nB, the structure and the operation of the clock-delayed domino logic circuit 10B illustrated in FIG. 2 are the same or substantially the same as those of the clock-delayed domino logic circuit 10A illustrated in FIG. 1.

The first phase control circuit 13-1B may output the logic level of the power supply node Vdd or the first evaluation node EN1 in response to the first clock signal CLK1. The first phase control circuit 13-1B may include a PMOS transistor P41 and an NMOS transistor N21 connected in series between the power supply node Vdd and the first evaluation node EN1.

The PMOS transistor P41 may control connection between the power supply node Vdd and a first node ND1 in response to the first clock signal CLK1 input to its gate. The NMOS transistor N21 may control connection between the first evaluation node EN1 and the first node ND1 in response to the first clock signal CLK1 input to its gate.

When the first clock signal CLK1 is at the first level, e.g., the low level, the PMOS transistor P41 applies the power supply voltage to the first node ND1 in response to the first clock signal CLK1. The NMOS transistor N21 is disabled. Accordingly, the logic level of the first node ND1 becomes the logic level of the power supply node Vdd, e.g., a high level.

When the first clock signal CLK1 is at the second level, e.g., the high level, the PMOS transistor P41 is disabled and the NMOS transistor N21 is enabled. Accordingly, the logic level of the first node ND1 becomes the logic level of the first evaluation node EN1. Since the first evaluation circuit N11 is enabled, the logic level of the first node ND1 becomes a low level. The PMOS transistor P41 and the NMOS transistor N21 may function as an inverter that inverts the first clock signal CLK1 and outputs an inverted signal of the first clock signal CLK1.

The structure and the operation of the first phase control circuit 13-1B are the same or substantially the same as those of each of the phase control circuits 13-2B through 13-nB.

During the evaluation of a current logic stage, e.g., the first logic stage 10-1B, for example, while the logic level of the first dynamic node DN1 is determined, the clock-delayed domino logic circuit 10B delays a clock signal output to a subsequent logic stage, e.g., the second clock signal CLK2, thereby reducing the influence of OCV.

Direct connections between the nodes ND1 through NDn and the evaluation nodes EN1 through ENn, respectively, are prevented by NMOS transistors N21 through N2n, respectively, in the clock-delayed domino logic circuit 10B, so that the clock-delayed domino logic circuit 10B operates stably.

Figure 3:
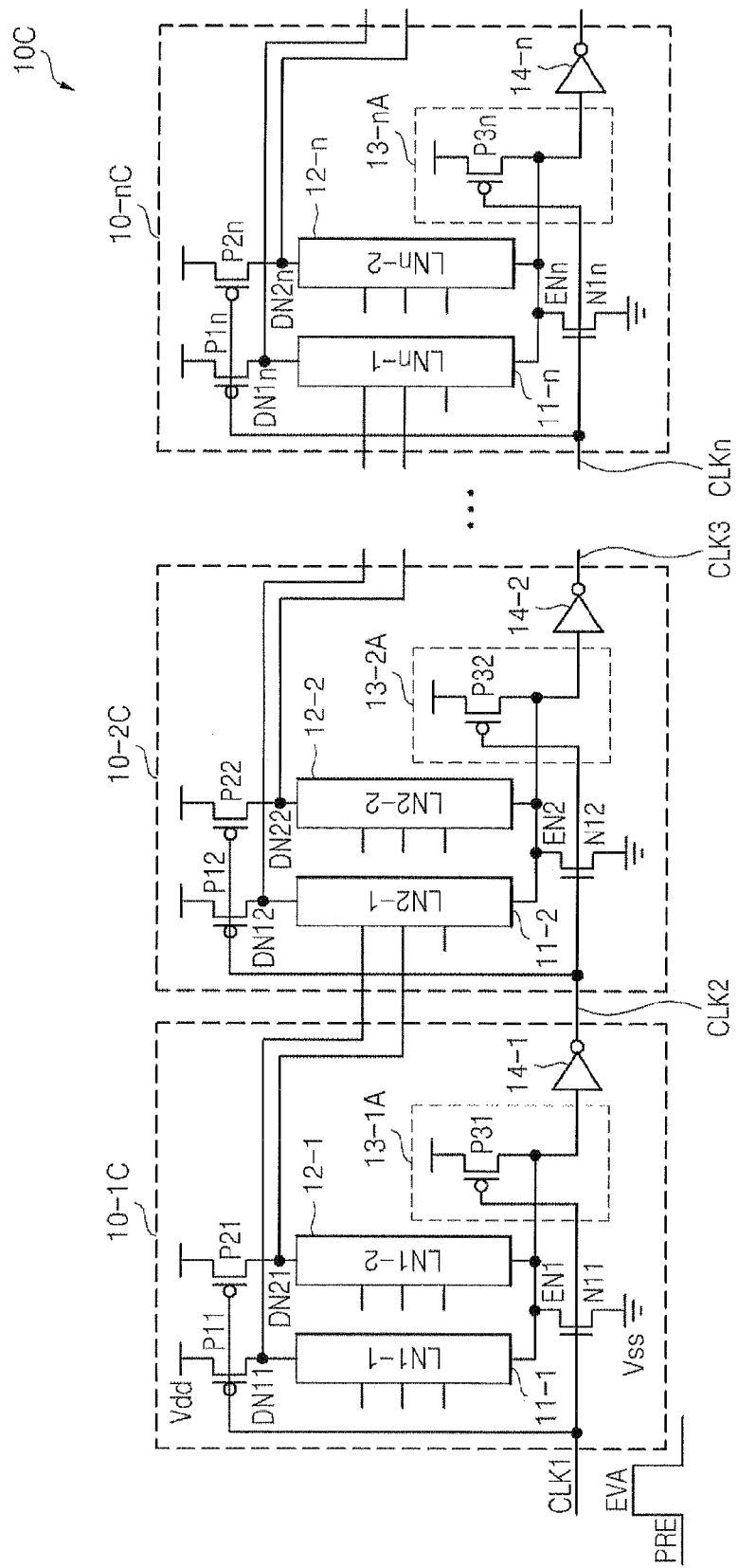
FIG. 3 is a block diagram of a clock-delayed domino logic circuit according to an embodiment of the inventive concept.

FIG. 3 is a block diagram of a clock-delayed domino logic circuit 10C according to an embodiment of the inventive concept. Referring to FIG. 3, the clock-delayed domino logic circuit 10C includes logic gates (or logic stages) 10-1C through 10-nC where "n" is a natural number.

The structure and the operation of the clock-delayed domino logic circuit 10C illustrated in FIG. 3 are the same or substantially the same as those of the clock-delayed domino logic circuit 10A illustrated in FIG. 1 except that each of the logic gates 10-1C through 10-nC includes a plurality of precharge circuits and a plurality of logic networks.

The first logic gate 10-1C includes a plurality of first precharge circuits P11 and P21, a plurality of first logic networks 11-1 and 12-1, the first evaluation node EN1, the first phase control circuit 13-1A, and the first inverter 14-1.

Although the two first precharge circuits P11 and P21 and the two first logic networks 11-1 and 12-1 are illustrated in FIG. 3 for convenience of description, the number of first precharge circuits and the number of first logic networks may be at least 3.

The precharge circuit P11 controls connection between the power supply node Vdd and a dynamic node DN11 in response to the first clock signal CLK1 input to a control terminal. The precharge circuit P21 controls connection between the power supply node Vdd and a dynamic node DN21 in response to the first clock signal CLK1 input to a control terminal. Each of the first precharge circuits P11 and P21 may be implemented by a PMOS transistor including the control terminal, e.g., a gate, which receives the first clock signal CLK1.

The logic network 11-1 may determine the logic level of the dynamic node DN11 based on some of first input signals. The logic network 12-1 may determine the logic level of the dynamic node DN21 based on the rest of the first input signals.

According to an embodiment, each of the first logic networks 11-1 and 12-1 may be implemented by a Boolean circuit, such as an AND gate, an OR gate, a NAND gate, a NOR gate, or an AOI. For instance, according to an embodiment, each of the first logic networks 11-1 and 12-1 may be implemented by NMOS transistors that are gated by the first input signals, respectively.

When the first clock signal CLK1 is at the first level, e.g., the low level, the first precharge circuits P11 and P21 apply the precharge voltage, e.g., the power supply voltage, to the dynamic nodes DN11 and DN21, respectively, in response to the first clock signal CLK1.

When the first clock signal CLK1 is at the second level, e.g., the high level, the first precharge circuits P11 and P21 the first phase control circuit 13-1A are disabled and the first evaluation circuit N11 is enabled in response to the first clock signal CLK1. For example, the first evaluation circuit N11 creates an evaluation path in response to the first clock signal CLK1.

Accordingly, the first logic network 11-1 may determine the logic level of the dynamic node DN11 based on some of the first input signals, and the first logic network 12-1 may determine the logic level of the dynamic node DN21 based on the rest of the first input signals.

The structures and the operations of the logic gates 10-1C through 10-nC are the same or substantially the same.

During the evaluation of a current logic stage, e.g., the first logic stage 10-1C, for example, while the logic levels of the dynamic nodes DN11 and DN21 are determined, the clock-delayed domino logic circuit 10C delays a clock signal output to a subsequent logic stage, e.g., the second clock signal CLK2, thereby reducing the influence of OCV.

Figure 4:
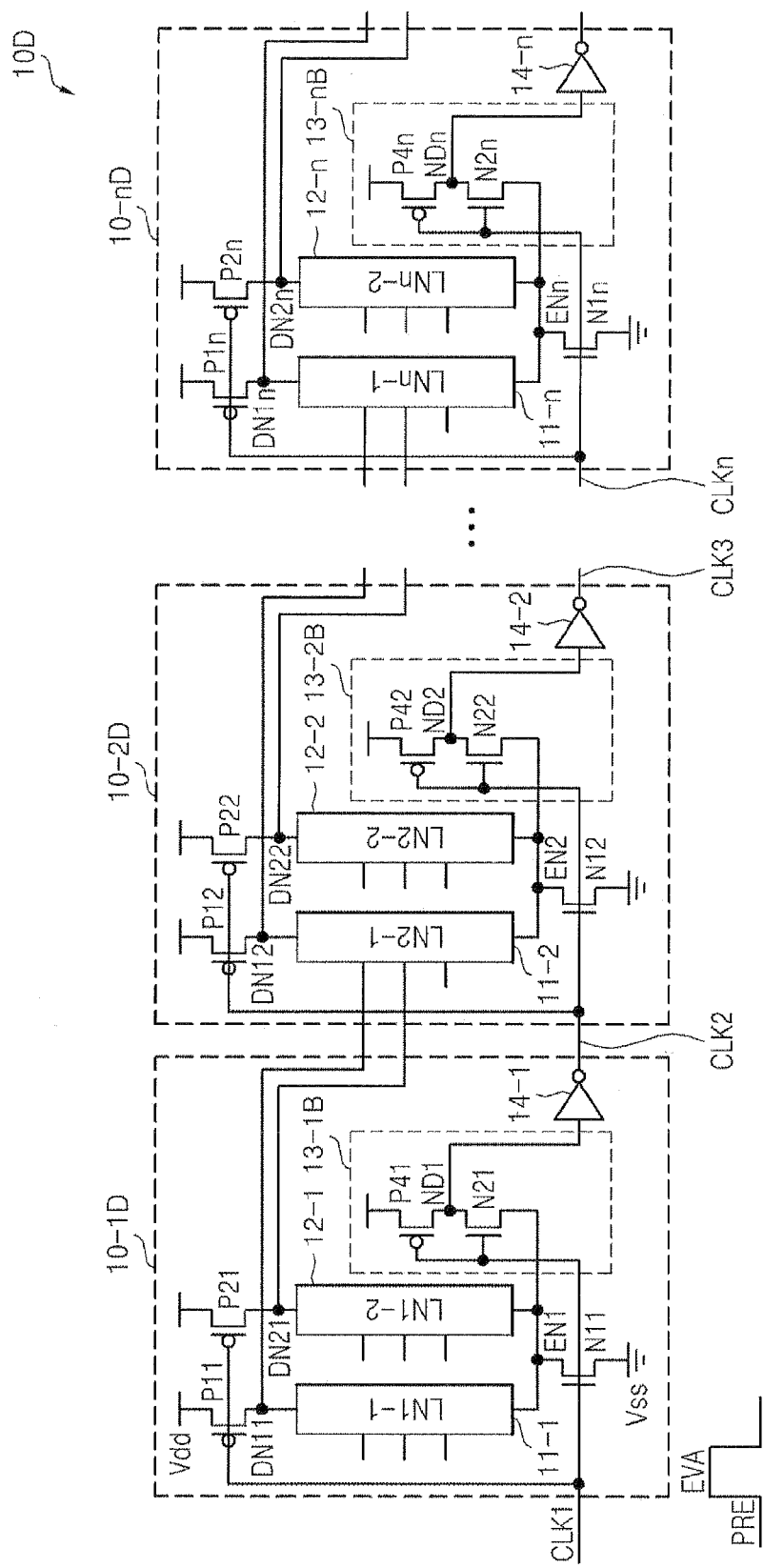
FIG. 4 is a block diagram of a clock-delayed domino logic circuit according to an embodiment of the inventive concept.

FIG. 4 is a block diagram of a clock-delayed domino logic circuit 10D according to an embodiment of the inventive concept. Referring to FIG. 4, the clock-delayed domino logic circuit 10D includes logic gates (or logic stages) 10-1D through 10-nD where "n" is a natural number.

The structure and the operation of the clock-delayed domino logic circuit 10D illustrated in FIG. 4 are the same or substantially the same as those of the clock-delayed domino logic circuit 10B illustrated in FIG. 2 except that each of the logic gates 10-1D through 10-nD includes a plurality of precharge circuits and a plurality of logic networks. In addition, the structure and the operation of the clock-delayed domino logic circuit 10D illustrated in FIG. 4 are substantially the same as those of the clock-delayed domino logic circuit 10C illustrated in FIG. 3 except for the phase control circuits 13-1B through 13-nB.

During the evaluation of a current logic stage, e.g., the first logic stage 10-1D, for example, while the logic levels of the dynamic nodes DN11 and DN21 are determined, the clock-delayed domino logic circuit 10D delays a clock signal output to a subsequent logic stage, e.g., the second clock signal CLK2, thereby reducing the influence of OCV. Direct connections between the nodes ND1 through NDn and the evaluation nodes EN1 through ENn, respectively, are prevented by NMOS transistors N21 through N2n, respectively, in the clock-delayed domino logic circuit 10D, so that the clock-delayed domino logic circuit 10D operates stably.

Figure 5:
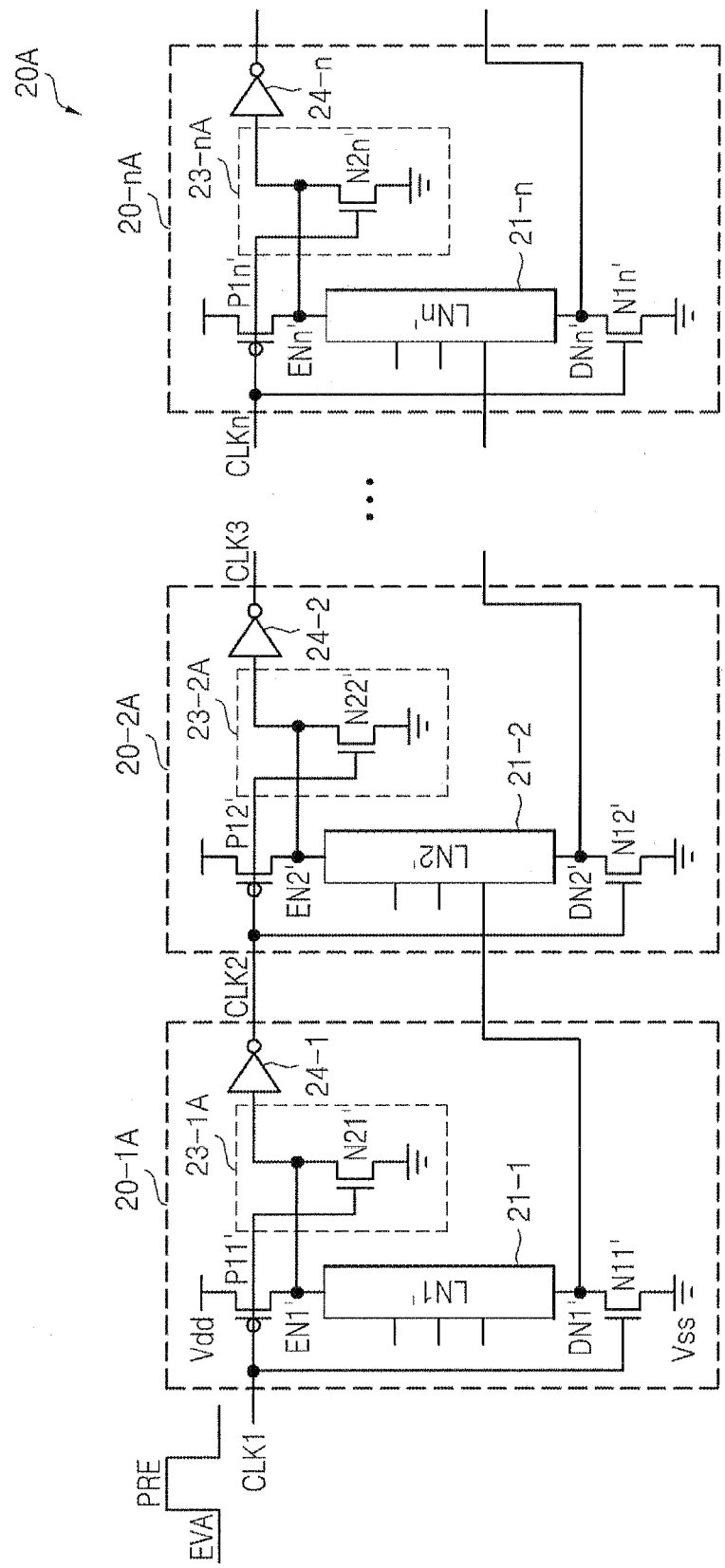
FIG. 5 is a block diagram of a clock-delayed domino logic circuit according to an embodiment of the inventive concept.

FIG. 5 is a block diagram of a clock-delayed domino logic circuit 20A according to an embodiment of the inventive concept. Referring to FIG. 5, the clock-delayed domino logic circuit 20A includes logic gates 20-1A through 20-nA.

The first logic gate 20-1A includes a first precharge circuit N11', a first evaluation circuit P11', a first logic network 21-1, a first phase control circuit 23-1A, and an inverter 24-1.

The first precharge circuit N11' controls connection between the ground node (or the precharge node) Vss and a first dynamic node DN1' in response to the first clock signal CLK1 input to a control terminal. According to an embodiment, the first precharge circuit N11' may be implemented by an NMOS transistor including the control terminal, e.g., a gate, which receives the first clock signal CLK1.

The first evaluation circuit P11' controls connection between a first evaluation node EN1' and the power supply node Vdd in response to the first clock signal CLK1 input to a control terminal According to an embodiment, the first evaluation circuit P11' may be implemented by a PMOS transistor including the control terminal, e.g., a gate, which receives the first clock signal CLK1. According to an embodiment, the first evaluation circuit P11' may be implemented by a multi-finger transistor.

The first logic network 21-1 is connected between the first precharge circuit N11' and the first evaluation circuit P11'. The first logic network 21-1 may determine the logic level of the first dynamic node DN1' based on first input signals. According to an embodiment, the first logic network 21-1 may be implemented by a Boolean circuit, such as an AND gate, an OR gate, a NAND gate, a NOR gate, or an AOI. For instance, according to an embodiment, the first logic network 21-1 may be implemented by PMOS transistors gated in response to the first input signals, respectively.

The first phase control circuit 23-1A may output the logic level of the ground node Vss or the first evaluation node EN1' in response to the first clock signal CLK1. According to an embodiment, the first phase control circuit 23-1A may be implemented by an NMOS transistor N21' including a control terminal, e.g., a gate, receiving the first clock signal CLK1. The NMOS transistor N21' may control connection between the ground node Vss and the first evaluation node EN1' in response to the first clock signal CLK1.

The first inverter 24-1 inverts an output signal of the first phase control circuit 23-1A, e.g., the logic level of the first evaluation node EN1' and outputs an inverted output signal as the second clock signal CLK2.

When the first clock signal CLK1 is at the second level, e.g., the high level, the first precharge circuit N11' applies the precharge voltage, e.g., a ground voltage, to the first dynamic node DN1' in response to the first clock signal CLK1. The first precharge circuit N11' discharges the first dynamic node DN1' in response to the first clock signal CLK1. The NMOS transistor N21' of the first phase control circuit 23-1A applies the ground voltage to the first evaluation node EN1', and the first evaluation circuit P11' is disabled in response to the first clock signal CLK1.

The first inverter 24-1 inverts the logic level of the ground node Vss, e.g., a low level and outputs the inverted logic level, e.g., a high level to the second logic gate 20-2A as the second clock signal CLK2.

In the precharge phase PRE, the first clock signal CLK1 remains at the second level.

When the first clock signal CLK1 is at the first level, e.g., the low level, the first precharge circuit N11' and the NMOS transistor N21° of the first phase control circuit 23-1A are disabled. The first evaluation circuit P11' is enabled in response to the first clock signal CLK1. Accordingly, the logic level of the first evaluation node EN1' becomes a high level.

The first evaluation circuit P11' creates an evaluation path in response to the first clock signal CLK1. Therefore, the first logic network 21-1 determines the logic level of the first dynamic node DN1' based on the first input signals.

The first inverter 24-1 inverts the logic level of the first evaluation node EN1', e.g., the high level and outputs the inverted logic level, e.g., a low level to the second logic gate 20-2A as the second clock signal CLK2.

In the evaluation phase EVA, the first clock signal CLK1 remains at the first level.

The second logic gate 20-2A includes a second precharge circuit N12', a second evaluation circuit P12', a second logic network 21-2, a second phase control circuit 23-2A, and an inverter 24-2.

The second precharge circuit N12' controls connection between the ground node Vss and a second dynamic node DN2' in response to the second clock signal CLK2 input to a control terminal. According to an embodiment, the second precharge circuit N12' may be implemented by an NMOS transistor including the control terminal, e.g., a gate, which receives the second clock signal CLK2.

The second evaluation circuit P12' controls connection between a second evaluation node EN2' and the power supply node Vdd in response to the second clock signal CLK2 input to a control terminal. According to an embodiment, the second evaluation circuit P12' may be implemented by a PMOS transistor including the control terminal, e.g., a gate, receiving the second clock signal CLK2.

The second logic network 21-2 is connected between the second precharge circuit N12' and the second evaluation circuit P12'. The second logic network 21-2 may determine the logic level of the second dynamic node DN2' based on second input signals. One of the second input signals may correspond to the logic level of the first dynamic node DN1'. According to an embodiment, the second logic network 21-2 may be implemented by a Boolean circuit, such as an AND gate, an OR gate, a NAND gate, a NOR gate, or an AOI. For instance, according to an embodiment, the second logic network 21-2 may be implemented by PMOS transistors gated in response to the second input signals, respectively.

The second phase control circuit 23-2A may output the logic level of the ground node Vss or the second evaluation node EN2' in response to the second clock signal CLK2. According to an embodiment, the second phase control circuit 23-2A may be implemented by an NMOS transistor N22' including a control terminal, e.g., a gate, receiving the second clock signal CLK2. The NMOS transistor N22' may control connection between the ground node Vss and the second evaluation node EN2' in response to the second clock signal CLK2.

The second inverter 24-2 inverts an output signal of the second phase control circuit 23-2A, e.g., the logic level of the second evaluation node EN2' and outputs an inverted output signal as the third clock signal CLK3.

When the second clock signal CLK2 is at the second level, e.g., the high level, the second precharge circuit N12' applies the precharge voltage, e.g., the ground voltage, to the second dynamic node DN2' in response to the second clock signal CLK2. For example, the second precharge circuit N12' discharges the second dynamic node DN2' in response to the second clock signal CLK2. The NMOS transistor N22' of the second phase control circuit 23-2A applies the ground voltage to the second evaluation node EN2' and the second evaluation circuit P12' is disabled, in response to the second clock signal CLK2.

The second inverter 24-2 inverts the logic level of the ground node Vss, e.g., the low level and outputs the inverted logic level, e.g., the high level as the third clock signal CLK3.

When the second clock signal CLK2 is at the first level, e.g., the low level, the second precharge circuit N12' and the NMOS transistor N22' of the second phase control circuit 23-2A are disabled. The second evaluation circuit P12' is enabled in response to the second clock signal CLK2. Accordingly, the logic level of the second evaluation node EN2' becomes a high level.

The second evaluation circuit P12' creates an evaluation path in response to the second clock signal CLK2. Therefore, the second logic network 21-2 may determine the logic level of the second dynamic node DN2' based on the second input signals.

The second inverter 24-2 inverts the logic level of the second evaluation node EN2', e.g., the high level and outputs the inverted logic level, e.g., a low level as the third clock signal CLK3.

The n-th logic gate 20-nA includes an n-th precharge circuit N1n', an n-th evaluation circuit P1n', an n-th logic network 21-n, an n-th phase control circuit 23-nA, and an inverter 24-n.

The n-th precharge circuit N1n' controls connection between the ground node Vss and an n-th dynamic node DNn' in response to the n-th clock signal CLKn input to a control terminal. According to an embodiment, the n-th precharge circuit N1n' may be implemented by an NMOS transistor including the control terminal, e.g., a gate, which receives the n-th clock signal CLKn.

The n-th evaluation circuit P1n' controls connection between an n-th evaluation node ENn' and the power supply node Vdd in response to the n-th clock signal CLKn input to a control terminal. According to an embodiment, the n-th evaluation circuit P1n' may be implemented by a PMOS transistor including the control terminal, e.g., a gate, which receives the n-th clock signal CLKn.

The n-th logic network 21-n is connected between the n-th precharge circuit N1n' and the n-th evaluation circuit P1n'. The n-th logic network 21-n may determine the logic level of the n-th dynamic node DNn' based on n-th input signals. One of the n-th input signals may correspond to the logic level of the (n−1)-th dynamic node. According to an embodiment, the n-th logic network 21-n may be implemented by a Boolean circuit, such as an AND gate, an OR gate, a NAND gate, a NOR gate, or an AOI. For instance, according to an embodiment, the n-th logic network 21-n may be implemented by PMOS transistors gated in response to the n-th input signals, respectively.

The n-th phase control circuit 23-nA may output the logic level of the ground node Vss or the n-th evaluation node ENn' in response to the n-th clock signal CLKn. According to an embodiment, the n-th phase control circuit 23-nA may be implemented by an NMOS transistor N2n' including a control terminal, e.g., a gate, receiving the n-th clock signal CLKn. The NMOS transistor N2n' may control connection between the ground node Vss and the n-th evaluation node ENn' in response to the n-th clock signal CLKn.

The n-th inverter 24-n inverts an output signal of the n-th phase control circuit 23-nA, e.g., the logic level of the n-th evaluation node ENn' and outputs an inverted output signal.

When the n-th clock signal CLKn is at the second level, e.g., the high level, the n-th precharge circuit N1n' applies the precharge voltage, e.g., the ground voltage, to the n-th dynamic node DNn' in response to the n-th clock signal CLKn. For example, the n-th precharge circuit N1n' discharges the n-th dynamic node DNn' in response to the n-th clock signal CLKn. The NMOS transistor N2n' of the n-th phase control circuit 23-nA applies the ground voltage to the n-th evaluation node ENn' and the n-th evaluation circuit P1n' is disabled in response to the n-th clock signal CLKn.

The n-th inverter 24-n inverts the logic level of the ground node Vss, e.g., the low level and outputs the inverted logic level, e.g., the high level.

When the n-th clock signal CLKn is at the first level, e.g., the low level, the n-th precharge circuit N1n' and the NMOS transistor N2n' of the n-th phase control circuit 23-nA are disabled. The n-th evaluation circuit P1n' is enabled in response to the n-th clock signal CLKn. Accordingly, the logic level of the n-th evaluation node ENn' becomes a high level.

The n-th evaluation circuit P1n' creates an evaluation path in response to the n-th clock signal CLKn. Therefore, the n-th logic network 21-n may determine the logic level of the n-th dynamic node DNn' based on the n-th input signals.

The n-th inverter 24-n inverts the logic level of the n-th evaluation node ENn', e.g., the high level and outputs the inverted logic level, e.g., a low level.

During the evaluation of a current logic stage, e.g., the first logic stage 20-1A, for example, while the logic level of the first dynamic node DN1' is determined, the clock-delayed domino logic circuit 20A delays a clock signal output to a subsequent logic stage, e.g., the second clock signal CLK2, thereby reducing the influence of OCV.

Figure 6:
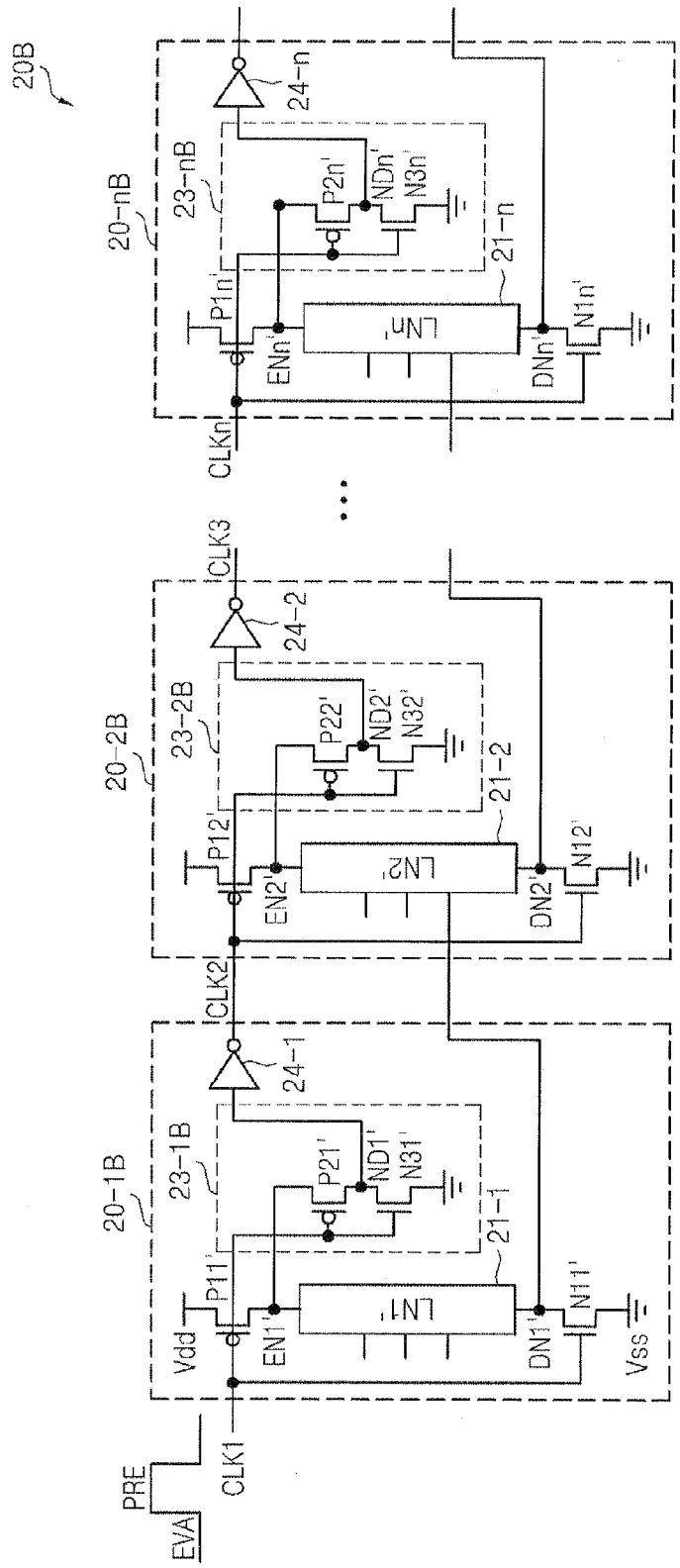
FIG. 6 is a block diagram of a clock-delayed domino logic circuit according to an embodiment of the inventive concept.

FIG. 6 is a block diagram of a clock-delayed domino logic circuit 20B according to an embodiment of the inventive concept. Referring to FIG. 6, the clock-delayed domino logic circuit 20B includes logic gates 20-1B through 20-nB.

The first logic gate 20-1B includes the first precharge circuit N11', the first evaluation circuit P11', the first logic network 21-1, a first phase control circuit 23-1B, and the inverter 24-1.

Except for phase control circuits 23-1B through 23-nB, the structure and the operation of the clock-delayed domino logic circuit 20B illustrated in FIG. 6 are the same or substantially the same as those of the clock-delayed domino logic circuit 20A illustrated in FIG. 5. The first phase control circuit 23-1B may output the logic level of the ground node Vss or the first evaluation node EN1' in response to the first clock signal CLK1. The first phase control circuit 23-1B may include an NMOS transistor N31' and a PMOS transistor P21' connected in series between the ground node Vss and the first evaluation node EN1'.

The NMOS transistor N31' may control connection between the ground node Vss and a first node ND1' in response to the first clock signal CLK1 input to its gate. The PMOS transistor P21' may control connection between the first evaluation node EN1' and the first node ND1' in response to the first clock signal CLK1 input to its gate.

When the first clock signal CLK1 is at the second level, e.g., the high level, the NMOS transistor N31' applies the ground voltage to the first node ND1' and the PMOS transistor P21' is disabled in response to the first clock signal CLK1. Accordingly, the logic level of the first node ND1' becomes the logic level of the ground node Vss, e.g., the low level.

When the first clock signal CLK1 is at the first level, e.g., the low level, the NMOS transistor N31' is disabled and the PMOS transistor P21' is enabled. Accordingly, the logic level of the first node ND1' becomes the logic level of the first evaluation node ENV. Since the first evaluation circuit N11' is enabled, the logic level of the first node ND1' becomes a high level. For example, the NMOS transistor N31' and the PMOS transistor P21' may function as an inverter that inverts the first clock signal CLK1 and outputs an inverted signal of the first clock signal CLK1.

The structure and the operation of the first phase control circuit 23-1B are the same or substantially the same as those of each of the phase control circuits 23-2B through 23-nB.

During the evaluation of a current logic stage, e.g., the first logic stage 20-1B, for example, while the logic level of the first dynamic node DN1' is determined, the clock-delayed domino logic circuit 20B delays a clock signal output to a subsequent logic stage, e.g., the second clock signal CLK2, thereby reducing the influence of OCV. Direct connections between the nodes ND1' through NDn' and the evaluation nodes EN1' through ENn', respectively, are prevented by PMOS transistors P21' through P2n', respectively, in the clock-delayed domino logic circuit 20B, so that the clock-delayed domino logic circuit 20B operates stably.

Figure 7:
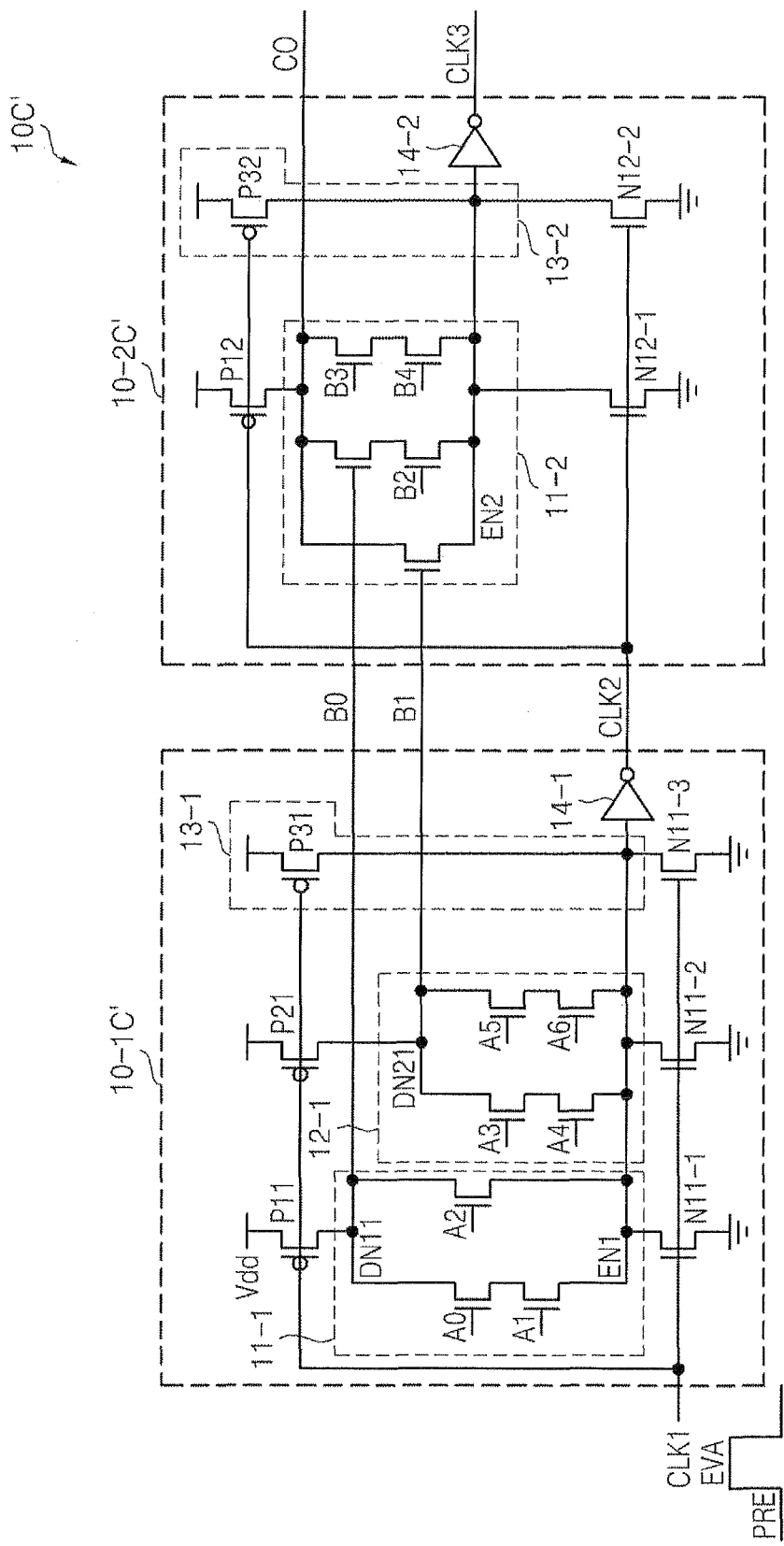
FIG. 7 is a circuit diagram of an example of the clock-delayed domino logic circuit illustrated in FIG. 3.

FIG. 7 is a circuit diagram of an example 10C' of the clock-delayed domino logic circuit 10C illustrated in FIG. 3. Referring to FIG. 7, the clock-delayed domino logic circuit 10C' includes a first logic gate 10-1C' and a second logic gate 10-2C'.

The first logic gate 10-1C' includes a plurality of first precharge circuits P11 and P21, a plurality of first evaluation circuits N11-1 through N11-3, a plurality of first logic networks 11-1 and 12-1, a first phase control circuit 13-1, and an inverter 14-1.

According to an embodiment, the first evaluation circuits N11-1 through N11-3 illustrated in FIG. 7 correspond to a multi-finger transistor by which the NMOS transistor N11 illustrated in FIG. 3 is implemented. For example, although the plurality of the first evaluation circuits N11-1 through N11-3 are illustrated in FIG. 7, the plurality of the first evaluation circuits N11-1 through N11-3 may be implemented by a single NMOS transistor.

When the first clock signal CLK1 is at the low level, the precharge circuit P11 applies the power supply voltage to the dynamic node DN11 in response to the first clock signal CLK1, and the precharge circuit P21 applies the power supply voltage to the dynamic node DN21 in response to the first clock signal CLK1. The first evaluation circuits N11-1 through N11-3 are disabled, so that an evaluation path is not created.

The PMOS transistor P31 included in the first phase control circuit 13-1 applies the power supply voltage to the first evaluation node EN1 in response to the first clock signal CLK1. For example, the first phase control circuit 13-1 outputs the logic level of the power supply node Vdd, e.g., the high level, to the first inverter 14-1.

The first inverter 14-1 inverts the output signal of the first phase control circuit 13-1, e.g., the high level and outputs an inverted signal, e.g., the low level as the second clock signal CLK2 to the second logic gate 10-2C'.

When the first clock signal CLK1 is at the high level, the first precharge circuits P11 and P21 are disabled, and the first evaluation circuits N11-1 through N11-3 form the evaluation path in response to the first clock signal CLK1. The logic network 11-1 determines the logic level of the dynamic node DN11 based on some signals A0, A1, and A2 among first input signals A0 through A6, and the logic network 12-1 determines the logic level of the dynamic node DN21 based on the remaining signals A3 through A6 among the first input signals A0 through A6.

For instance, according to an embodiment, when the first logic networks 11-1 and 12-1 are embodied as shown in FIG. 7, the logic network 11-1 may determine the logic level of the dynamic node DN11 according to a result of $(A0 \cap A1) \cup A2$ and the logic network 12-1 may determine the logic level of the dynamic node DN21 according to a result of $(A3 \cap A4) \cup (A5 \cap A6)$.

Since the PMOS transistor P31 of the first phase control circuit 13-1 is disabled, the first inverter 14-1 inverts the logic level of the first evaluation node EN1 and outputs an inverted logic level as the second clock signal CLK2 to the second logic gate 10-2C'.

The logic level of the first evaluation node EN1 becomes the low level when the evaluation of each of the first logic networks 11-1 and 12-1 ends. As a result, the first logic gate 10-1C' can delay the second clock signal CLK2, by the time the logic levels of the dynamic nodes DN11 and DN21 are output as second input signals B0 and B1 to the second logic gate 10-2C'.

According to an embodiment, the clock-delayed domino logic circuits (10A through 10D, 20A, and 20B, generically denoted by reference numeral 10) may be connected between a latch and a flip-flop. According to an embodiment, the flip-flop may be a static flip-flop, a dynamic flip-flop, or a semi-dynamic flip-flop.

Figure 8:
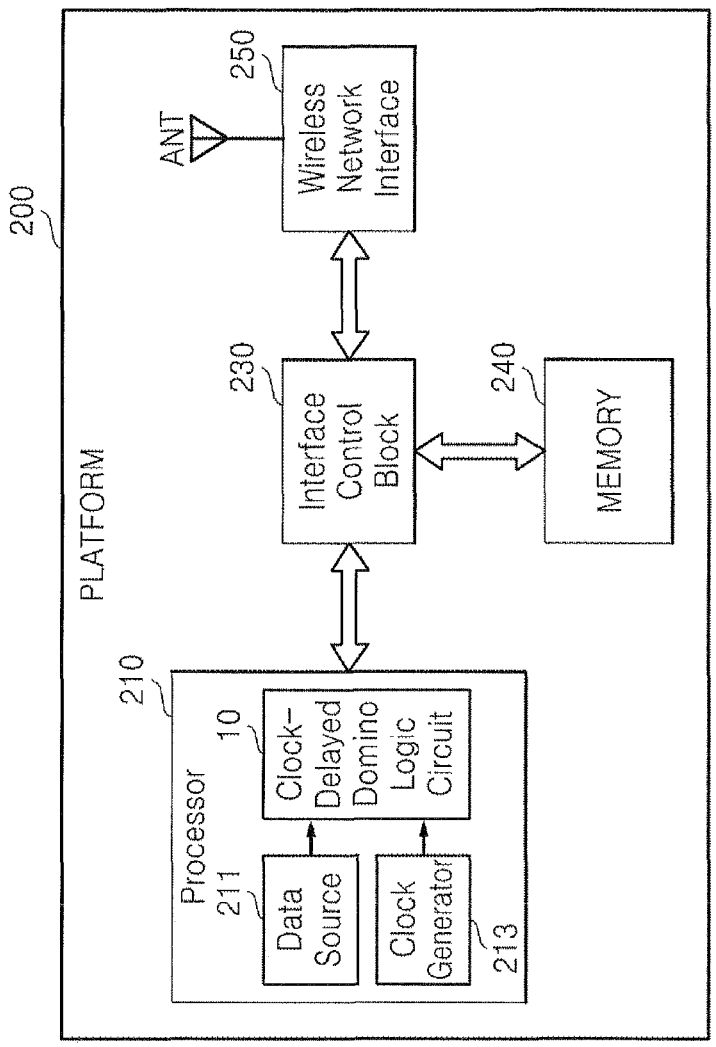
FIG. 8 is a block diagram of an electronic device including a clock-delayed domino logic circuit according to an embodiment of the inventive concept.

FIG. 8 is a block diagram of an electronic device 200 including the clock-delayed domino logic circuit 10 according to an embodiment of the inventive concept. According to an embodiment, the electronic device 200 may be a computer platform 200 that may be used in an electronic system, such as a computing system.

The electronic system may be a personal computer (PC) or a portable device. The portable device may be a laptop computer, a mobile telephone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, or an e-book.

The computer platform or the electronic device 200 includes a processor or a central processing unit (CPU) 210, an interface control block 230, a memory 240, and a wireless network interface 250. The computer platform or the electronic device 200 may be implemented as a system-on-chip (SoC).

The processor 210 including at least one core includes a data processing device, which includes a data source 221, a clock generator 223, and the clock-delayed domino logic circuit 10.

The data source 221 may output data to the clock-delayed domino logic circuit 10. The clock generator 223 may output a clock signal to the clock-delayed domino logic circuit 10. At least one element among the data source 221, the clock generator 223, and the clock-delayed domino logic circuit 10 may be implemented in an independent chip separated from the processor 210, may be implemented as a part of the processor 210, or may be implemented in the processor 210.

The clock-delayed domino logic circuit 10 performs evaluation based on the clock signal received from the clock generator 223 and the data received from the data source 221.

The processor 210 may communicate with the memory 240 and the wireless network interface 250 through the interface control block 230.

The interface control block 230 includes one or more circuit blocks that can perform various interface control functions. The control functions may include memory access control, graphic control, input/output interface control, and wireless network access control. Each of the circuit blocks may be implemented in an independent chip, may be implemented as a part of the processor 210, or may be implemented in the processor 210.

The memory 240 may transmit and receive data to and from the processor 210 through the interface control block 230. The wireless network interface 250 may connect the electronic device 200 to a wireless network, e.g., a mobile communication network or a wireless local area network (LAN), through an antenna ANT.

FIG. 9 is a flowchart of an operation method of the clock-delayed domino logic circuit 10 according to an embodiment of the inventive concept. Referring to FIG. 9, in the evaluation phase EVA, the clock-delayed domino logic circuit 10 outputs the first logic level of an evaluation node of a current logic gate among a plurality of logic gates included in the clock-delayed domino logic circuit 10 in operation S100. The clock-delayed domino logic circuit 10 inverts the first logic level and outputs an inverted level of the first logic level as a clock signal for a subsequent logic gate in operation S120.

In the precharge phase PRE, the clock-delayed domino logic circuit 10 outputs the second logic level of a precharge node of the current logic gate in operation S140. The clock-delayed domino logic circuit 10 inverts the second logic level and outputs an inverted level of the second logic level as the clock signal for the subsequent logic gate in operation S160.

According to the embodiments of the inventive concept, a clock-delayed domino logic circuit can terminate the evaluation of a logic network while a phase control circuit delays a clock signal. The clock-delayed domino logic circuit uses fewer transistors than conventional clock-delayed domino logic circuits, thereby reducing the cost.

Exemplary embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A clock-delayed domino logic circuit comprising:
   precharge circuit configured to control connection between a first node and a dynamic node in response to a clock signal;
   an evaluation circuit configured to control connection between a second node and an evaluation node in response to the clock signal;
   a logic network connected between the dynamic node and the evaluation node, the logic network configured to determine a logic level of the dynamic node based on a plurality of input signals; and
   a phase control circuit configured to output a logic level of the evaluation node or a logic level of the first node according to a level of the clock signal, wherein the phase control circuit includes an inverter connected between the first node and the evaluation node, wherein the inverter is configured to invert the clock signal.

2. The clock-delayed domino logic circuit of claim 1, wherein the first node is one of a power supply node and a ground node, and the second node is the other of the power supply node and the ground node.

3. The clock-delayed domino logic circuit of claim 1, further comprising an inverter configured to invert an output signal of the phase control circuit.

4. The clock-delayed domino logic circuit of claim 1, wherein the logic network includes at least one of an AND gate, an OR gate, a NAND gate, a NOR gate, or an AND-OR-inverter (AOI).

5. A clock-delayed domino logic circuit, comprising:
   a precharge circuit configured to control connection between a first node and a dynamic node in response to a clock signal;
   an evaluation circuit configured to control connection between a second node and an evaluation node in response to the clock signal;
   a logic network connected between the dynamic node and the evaluation node, the logic network configured to determine a logic level of the dynamic node based on a plurality of input signals; and
   a phase control circuit configured to output a logic level of the evaluation node or a logic level of the first node according to a level of the clock signal, wherein the logic network includes a plurality of N-channel metal oxide semiconductor (NMOS) transistors that are configured to be gated in response to the plurality of input signals, respectively, and wherein the phase control circuit is configured to output the logic level of the evaluation node when the clock signal is at a high level and to output the logic level of the first node when the clock signal is at a low level.

6. A clock-delayed domino logic circuit, comprising:
a precharge circuit configured to control connection between a first node and a dynamic node in response to a clock signal;
an evaluation circuit configured to control connection between a second node and an evaluation node in response to the clock signal;
a logic network connected between the dynamic node and the evaluation node, the logic network configured to determine a logic level of the dynamic node based on a plurality of input signals; and
a phase control circuit configured to output a logic level of the evaluation node or a logic level of the first node according to a level of the clock signal, wherein the logic network includes a plurality of P-channel metal oxide semiconductor (PMOS) transistors that are configured to be gated in response to the plurality of input signals, respectively, and wherein
the phase control circuit is configured to output the logic level of the first node when the clock signal is at a high level and to output the logic level of the evaluation node when the clock signal is at a low level.

7. The clock-delayed domino logic circuit of claim 1, wherein the phase control circuit includes a switch configured to control connection between the first node and the evaluation node in response to the clock signal.

8. A data processing device comprising:
a clock generator configured to generate a clock signal;
a data source configured to output data; and
a clock-delayed domino logic circuit,
wherein the clock-delayed domino logic circuit includes:
precharge circuit configured to control connection between a first node and a dynamic node in response to the clock signal;
an evaluation circuit configured to control connection between a second node and an evaluation node in response to the clock signal;
a logic network connected between the dynamic node and the evaluation node, the logic network configured to determine a logic level of the dynamic node based on the data; and
a phase control circuit configured to output a logic level of the evaluation node or a logic level of the first node according to a level of the clock signal, wherein the phase control circuit includes an inverter connected between the first node and the evaluation node, wherein the inverter is configured to invert the clock signal.

9. The data processing device of claim 8, wherein the phase control circuit includes a switch configured to control connection between the first node and the evaluation node in response to the clock signal.

10. The data processing device of claim 8, further comprising an inverter configured to invert an output signal of the phase control circuit.

11. The data processing device of claim 8, wherein the data processing device is provided in a system-on-chip.

12. An electronic device comprising:
a processor including a data processing device; and
a wireless network interface connected to the processor through an interface control block,
wherein the data processing device includes:
a clock generator configured to generate a clock signal;
a data source configured to output data; and
a clock-delayed domino logic circuit,
wherein the clock-delayed domino logic circuit includes:
a precharge circuit configured to control connection between a first node and a dynamic node in response to the clock signal;
an evaluation circuit configured to control connection between a second node and an evaluation node in response to the clock signal;
a logic network connected between the dynamic node and the evaluation node, the logic network configured to determine a logic level of the dynamic node based on the data; and
a phase control circuit configured to output a logic level of the evaluation node or a logic level of the first node according to a level of the clock signal, wherein the phase control circuit includes an inverter connected between the first node and the evaluation node, wherein the inverter is configured to invert the clock signal.

13. The electronic device of claim 12, wherein the phase control circuit includes a switch configured to control connection between the first node and the evaluation node in response to the clock signal.

14. The electronic device of claim 12, further includes an inverter configured to invert an output signal of the phase control circuit.

15. The electronic device of claim 12, wherein the data processing device is provided in a system-on-chip.

* * * * *